United States Patent
McLeod (10) Patent No.: US 6,843,892 B1
(45) Date of Patent: Jan. 18, 2005

(54) APPARATUS AND METHOD FOR SELECTIVELY AND CONTROLLABLY ELECTRICALLY BIASING A PLURALITY OF SUBSTRATES ON A PALLET

(75) Inventor: Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 253 days.

(21) Appl. No.: 10/212,693

(22) Filed: Aug. 7, 2002

Related U.S. Application Data
(60) Provisional application No. 60/357,889, filed on Feb. 19, 2002.

(51) Int. Cl.[7] ........................... C23C 16/00; C23C 14/34
(52) U.S. Cl. ............................. 204/192.12; 204/192.15; 204/192.2; 204/298.06; 204/298.15; 204/298.25; 118/719; 118/720; 118/728; 118/729; 118/500; 216/67; 156/345.31; 156/345.51; 156/345.54; 427/128; 427/130; 427/131; 427/132
(58) Field of Search ....................... 204/192.12, 192.15, 204/192.2, 298.06, 298.15, 298.25; 118/719, 720, 721, 728, 729, 500, 505; 216/67; 156/345.31, 345.51, 345.54; 427/128, 130, 131, 132, 251, 424

(56) References Cited

U.S. PATENT DOCUMENTS

| | | | |
|---|---|---|---|
| 4,473,455 A | 9/1984 | Dean et al. | 204/298.15 |
| 4,595,481 A | 6/1986 | Allen et al. | 204/298.15 |
| 4,650,064 A | 3/1987 | Slabaugh | 198/631.1 |
| 4,849,250 A | 7/1989 | Dee et al. | 427/599 |
| 5,244,555 A | 9/1993 | Allen et al. | 204/192.2 |
| 5,543,022 A | 8/1996 | Nguyen et al. | 204/298.15 |
| 5,700,725 A | 12/1997 | Hower et al. | 438/758 |
| 5,753,091 A | 5/1998 | Weber et al. | 204/298.15 |
| 5,814,196 A | 9/1998 | Hollars et al. | 204/298.15 |
| 5,891,311 A | 4/1999 | Lewis et al. | 204/192.12 |
| 5,938,902 A | 8/1999 | Nguyen et al. | 204/298.15 |

Primary Examiner—Rodney G. McDonald
(74) Attorney, Agent, or Firm—McDermott Will & Emery (57) ABSTRACT

An in-line, multi-station apparatus including an improved pallet for transporting a plurality of workpieces/substrates through the apparatus, the pallet comprising:

(a) a sheet of electrically conductive material provided with a plurality of spaced-apart regions extending at least partway therethrough, each of the regions adapted to mount therein and expose at least one major surface of respective workpieces/substrates for receipt of the treatment; and (b) a plurality of electrical contact means for selectively and controllably electrically contacting respective ones of said plurality of workpieces/substrates for applying an electrical bias potential thereto during treatment.

Embodiments include in-line apparatus for performing bias sputtering of electrically conductive thin films on insulative substrates in the manufacture of multi-layer magnetic and/or magneto-optical recording media.

30 Claims, 3 Drawing Sheets

APPARATUS AND METHOD FOR SELECTIVELY AND CONTROLLABLY ELECTRICALLY BIASING A PLURALITY OF SUBSTRATES ON A PALLET

CROSS-REFERENCE TO PROVISIONAL APPLICATION

This application claims priority from U.S. provisional patent application Ser. No. 60/357,889 filed Feb. 19, 2002, the entire disclosure of which is incorporated herein by reference.

FIELD OF THE INVENTION

The present invention relates to an apparatus and method for selectively and controllably applying an electrical bias potential to a plurality of substrates carried by a moving pallet past at least one substrate treating station. The invention has particular utility in the automated manufacture of magnetic or magneto-optical recording media comprising a multi-layer stack of thin film layers formed on an insulative substrate, e.g., a disk-shaped substrate, by means of a physical vapor deposition process, e.g., sputtering.

BACKGROUND OF THE INVENTION

Magnetic and MO media are widely employed in various applications, particularly in the computer industry for data/information storage and retrieval purposes. A magnetic medium in e.g., disk form, such as utilized in computer-related applications, comprises a non-magnetic substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack comprising a plurality of thin film layers constituting the medium are sequentially deposited. Such layers may include, in sequence from the workpiece (substrate) deposition surface, a plating layer, e.g., of amorphous nickel-phosphorus (Ni—P), a polycrystal line underlayer, typically of chromium (Cr) or a Cr-based alloy such as chromium-vanadium (Cr—V), a magnetic layer, e.g., of a cobalt (Co)-based alloy, and a protective overcoat layer, typically of a carbon-based material having good mechanical (i.e., tribological) properties. A similar situation exists with MO media, wherein a layer stack is formed which comprises a reflective layer, typically of a metal or metal alloy, one or more rare-earth thermo-magnetic (RE-TM) alloy layers, one or more dielectric layers, and a protective overcoat layer, for functioning as reflective, transparent, writing, writing assist, and read-out layers, etc.

According to conventional manufacturing methodology, a majority of the above-described layers constituting magnetic and/or MO recording media are deposited by cathode sputtering, typically by means of multi-cathode and/or multi-chamber sputtering apparatus wherein a separate cathode comprising a selected target material is provided for deposition of each component layer of the stack and the sputtering conditions are optimized for the particular component layer to be deposited. Each cathode comprising a selected target material can be positioned within a separate, independent process chamber, in a respective process chamber located within a larger chamber, or in one of a plurality of separate, interconnected process chambers each dedicated for deposition of a particular layer. According to such conventional manufacturing technology, a plurality of media substrates, typically in disk form, are serially transported by means of a multi-apertured pallet or similar type holder, in linear or circular fashion, depending upon the physical configuration of the particular apparatus utilized, from one sputtering target and/or process chamber to another for sputter deposition of a selected layer thereon.

Cost-effective productivity requirements imposed by automated manufacturing technology for magnetic and MO media require maximized sputter deposition rates, while at the same time, high quality, high areal recording density media require high purity thin film layers which exhibit respective physical, chemical, and/or mechanical properties, including, inter alia, proper crystal morphology necessary for obtaining high areal recording densities, e.g., polycrystallinity; good magnetic properties, e.g., coercivity and squareness ratio; chemical stability, e.g., inertness or corrosion resistance; and good tribological properties, e.g., wear resistance and low stiction/friction. Frequently, obtainment of such desirable physical, chemical, and/or mechanical properties for each of the constituent layers of the multi-layer media requires application of an electrical bias potential to the substrate during sputtering, e.g., a DC, AC, or RF bias potential, or some combination thereof, wherein the bias type and level of bias potential is optimized for each constituent layer.

For example, application of a suitable substrate bias during sputter deposition of metal-based underlayers and ferromagnetic metal alloy layers of thin film magnetic recording media can facilitate obtainment of preferred crystal orientations, and increase carbon (C) density of C-based protective overcoat layers of thin film magnetic and MO recording media. Application of suitable substrate bias potentials to metal-based substrates, e.g., Al or Al alloy disks, poses no significant problem in the continuous, automated manufacture of hard disk recording media, inasmuch as the electrically conductive disks are in electrical contact with the metal-based pallet utilized for transporting a plurality of disks in, e.g., vertical orientation, past a series of sputtering sources, which metal-based (e.g., Al-based) pallet can be easily electrically biased via sliding contacts at the base thereof.

However, application of suitable substrate bias to electrically insulative substrates during multi-layer sputter deposition thereon, e.g., as with recording media with glass, ceramic, glass-ceramic, or polymer-based substates, is problematic. According to current manufacturing practice in the manufacture of magnetic and/or MO recording media utilizing biassed sputter deposition onto non-conductive substrates, a problem arises in that the small tabs on the pallet required for holding the substrates (e.g., disks) vertically erect and on edge in the pallet apertures act to shield edge portions of the substrates from metal deposition, leaving the substrates uncoated at the points of contact with the pallet tabs. As a consequence, reliable electrical contact to the substrates for bias potential application during that deposition step and subsequent deposition steps cannot be established, and a metal coating layer must be preliminarily applied to the substrate surface(s) in a separate deposition system which provides full surface coverage. Disadvantageously, however, the current practice with non-conductive substrates, e.g., glass disks, of over-coating the entire surface(s) thereof with a metal layer in a separate vacuum system prior to multi-layer media deposition thereon involves several additional processing steps and expense.

Accordingly, there exists a need for improved means and methodology for vapor depositing, e.g., by sputtering techniques, at deposition rates consistent with the throughput requirements of automated manufacturing processing, multi-layer thin film stacks and laminates on the surfaces of a plurality of substrates carried by a common pallet, which means and methodology overcomes the drawback associated with the difficulty in applying a desired substrate bias during film deposition, as described supra. More specifically, there exists a need for improved means and methodology for sputtering high purity, high quality, thin film layer stacks or laminates having optimal physical, chemical, and/or mechanical properties for use in the manufacture of single- and/or dual-sided magnetic and/or MO media, e.g., in the form of disks, which means and methodology provide rapid simple, and cost-effective formation of such media, as well as various other products and manufactures comprising at least one thin film layer.

In particular, the present invention addresses and solves problems attendant upon sputter deposition of thin film layers onto electrically biased workpieces comprised of electrically insulative substrate materials, which thin film deposition is utilized, inter alia, in the manufacture of high quality, thin film magnetic and/or MO recording media, while maintaining full compatibility with all aspects of conventional automated manufacturing technology therefor. Further, the means and methodology afforded by the present invention enjoy diverse utility in the manufacture of various devices and articles requiring high purity, high quality thin films with optimal physical, chemical, and/or mechanical properties.

DISCLOSURE OF THE INVENTION

An advantage of the present invention is an improved pallet for transporting a plurality of workpieces/substrates through an apparatus adapted for performing at least one treatment of at least one surface of each of the workpieces/substrates.

Another advantage of the present invention is an improved pallet for selectively and controllably applying an electrical bias potential to a plurality of workpieces/substrates transported through an apparatus adapted for performing a plurality of treatments of at least one surface of each of the workpieces/substrates.

A further advantage of the present invention is an improved apparatus for performing a plurality of treatments of at least one surface of each of a plurality of workpieces/substrates.

A still further advantage of the present invention is an improved apparatus for performing a plurality of treatments of at least one surface of each of a plurality of workpieces/substrates, comprising an improved pallet for selectively and controllably applying an electrical bias potential to each of the plurality of workpieces/substrates.

Yet another advantage of the present invention is an improved method of treating a plurality of substrates.

Still another advantage of the present invention is an improved method of treating a plurality of substrates, utilizing an in-line treatment apparatus comprising an improved pallet for selectively and controllably applying an electrical bias potential to each of the plurality of workpieces/substrates.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a pallet for transporting a plurality of workpieces/substrates through an apparatus adapted for performing at least one treatment of at least one surface of each of the workpieces/substrates, comprising:

(a) a sheet of electrically conductive material provided with a plurality of spaced-apart regions extending at least partway therethrough, each of the regions adapted to mount therein and expose at least one major surface of respective workpieces/substrates for receipt of the treatment; and (b) a plurality of electrical contact means for selectively and controllably electrically contacting respective ones of the plurality of workpieces/substrates for applying an electrical bias potential thereto during the treatment.

In accordance with embodiments of the present invention, each of the plurality of electrical contact means (b) comprises an electrically conductive member adapted for movement of a contact element thereof from a first, out-of-contact position spaced from a respective region to a second, in-contact position adjacent the region, and vice versa, wherein each of the plurality of electrical contact means comprises an elongated electrically conductive member pivotably mounted to the sheet of electrically conductive material at a first end thereof for moving a second end thereof comprising said contact element from the first position to the second position, and vice versa.

According to certain embodiments of the present invention, each of the plurality of regions of the sheet of electrically conductive material comprises an aperture extending through the sheet for exposing a pair of opposed major surfaces of respective workpieces/substrates for receipt of the treatment; and each of the contact elements of the plurality of electrical contact means is adapted to provide electrical contact to respective pairs of opposed major surfaces of the workpieces/substrates.

In accordance with particular embodiments of the present invention, each of the plurality of apertures in the sheet of electrically conductive material is substantially circularly-shaped and adapted for mounting a disk-shaped workpiece/substrate therein; each of the plurality of electrical contact means is provided in areas of the sheet of electrically conductive material between adjacent apertures; and each of the plurality of electrical contact means is electrically connected to the sheet of electrically conductive material.

According to certain embodiments of the present invention, the sheet of electrically conductive material is comprised of a non-magnetic material; and at least a portion of each of the plurality of electrical contact means comprises a magnetic material for cooperating with a magnet means of the apparatus for moving the electrical contact means from the first position to the second position, and vice versa; whereas, according to certain other embodiments of the present invention, each of the plurality of electrical contact means comprises a tab means for providing at least one of: (1) guiding movement of the electrical contact means from the first position to the second position, and vice versa; and (2) cooperating with a mechanical means of the apparatus for moving the electrical contact means from the first position to the second position, and vice versa.

Another aspect of the present invention is an apparatus for performing a plurality of treatments of at least one surface of each of a plurality of workpieces/substrates, comprising:

(a) a plurality of treatment stations for performing a corresponding plurality of treatments of the at least one surface of each of the plurality of workpieces/substrates; and (b) a pallet adapted for mounting the plurality of workpieces/substrates, the pallet comprising:

($b_1$) a sheet of electrically conductive material provided with a plurality of spaced-apart regions extending at least partway therethrough, each of the regions adapted to mount therein and expose at least one major surface of respective workpieces/substrates for receipt of the treatment provided by the at least one treatment station; and ($b_2$) a plurality of electrical contact means for selectively and controllably electrically contacting respective ones of the plurality of workpieces/substrates for applying an electrical bias potential thereto during the treatment;

(c) means for transporting the pallet past the plurality of treatment stations; and (d) means for moving the plurality of electrical contact means from a first position to a second position, and vice versa, for selectively and controllably electrically contacting each of the plurality of workpieces/substrates during transport of the pallet past the plurality of treatment stations.

According to embodiments of the present invention, each of the plurality of electrical contact means comprises an electrically conductive member adapted for movement of a contact element thereof from a first, out-of-contact position spaced from a respective region to a second, in-contact position adjacent the region, and vice versa; wherein each of the plurality of electrical contact means comprises an elongated electrically conductive member pivotably mounted to the sheet of electrically conductive material at a first end thereof for moving a second end thereof comprising the contact element from the first position to the second position, and vice versa.

In accordance with certain embodiments of the present invention, each of the regions of the sheet of electrically conductive material comprises an aperture extending through the sheet for exposing a pair of opposed major surfaces of respective workpieces/substrates for receipt of the treatment; and each of the contact elements of the plurality of electrical contact means is adapted to provide electrical contact to each of the pairs of opposed major surfaces of the workpieces/substrates.

According to particular embodiments of the present invention, each of the plurality of apertures in the sheet of electrically conductive material is substantially circularly-shaped and adapted for mounting a disk-shaped workpiece substrate therein; each of the plurality of electrical contact means is provided in areas of the sheet of electrically conductive material between adjacent apertures; and each of the plurality of electrical contact means is electrically connected to the sheet of electrically conductive material.

In accordance with further embodiments of the present invention, the sheet of electrically conductive material is comprised of a non-magnetic material; at least a portion of each of the plurality of electrical contact means comprises a magnetic material; and the contact moving means comprises magnet means for cooperating with the portion of magnetic material for moving the electrical contact means from the first position to the second position, and vice versa, whereas, according to still further embodiments of the present invention, each of the plurality of electrical contact means comprises a tab means for providing at least one of: (1) guiding movement of the electrical contact means from the first position to the second position, and vice versa; and (2) cooperating with the contact moving means for moving the electrical contact means from the first position to the second position, and vice versa, and the contact moving means comprises mechanical means for moving the electrical contact means from the first position to the second position, and vice versa.

According to still further embodiments of the present invention, the pallet is adapted for mounting a plurality of vertically oriented workpieces/substrates; the plurality of treatment stations are physical vapor deposition (PVD) stations, e.g., sputter deposition stations, or the plurality of treatment stations includes at least one plasma treatment station; the apparatus is an in-line apparatus comprising a linearly arranged plurality of treatment stations selected from among physical vapor deposition stations and plasma treatment stations; and each of the plurality of treatment stations (a) is adapted for treating opposing surfaces of each of the plurality of workpieces/substrates.

Yet another aspect of the present invention is a method of treating a plurality of workpieces, comprising steps of:

(a) providing an apparatus comprising:
(i) a plurality of serially arranged treatment stations for performing respective treatments of at least one surface of each of the plurality of workpieces;
(ii) a pallet adapted for mounting the plurality of workpieces, the pallet comprising:
a sheet of electrically conductive material provided with a plurality of spaced-apart regions extending at least partway therethrough, each of the regions adapted to mount therein and expose at least one major surface of a respective workpiece for treatment by each treatment station; and
a plurality of electrical contact means for selectively and controllably electrically contacting respective ones of the plurality of workpieces for applying an electrical bias potential thereto during the treatment;
(iii) means for transporting the pallet past the plurality of serially arranged treatment stations; and
(iv) means for moving the plurality of electrical contact means from a first position out-of contact with respective ones of the workpieces to a second position in contact with respective ones of the workpieces, and vice versa: for selectively and controllably electrically contacting each of the plurality of workpieces during transport of the pallet past the plurality of treatment stations for selectively and controllably applying an electrical bias potential to each of the plurality of workpieces;

(b) mounting a plurality of workpieces on the pallet, each of the workpieces comprising an electrically insulative substrate;

(c) transporting the pallet with the plurality of workpieces mounted thereon past the plurality of treatment stations;

(d) maintaining each of the plurality of electrical contacts in the first position out-of-contact with a respective workpiece and depositing a first, electrically conductive layer on the at least one exposed surface of each of the plurality of workpieces at a first treatment station of the apparatus, whereby electrical bias potential is not applied to each of the plurality of workpieces during deposition of the first, electrically conductive layer; and (e) moving each of the plurality of electrical contacts to the second position in contact with a respective electrically conductive layer and performing at least one treatment of the at least one exposed surface of each of the plurality of workpieces at at least one serially positioned additional treatment station of the apparatus downstream of the first treatment station, while applying a selected electrical bias potential to each of the workpieces.

According to embodiments of the present invention, step (a) comprises providing an in-line apparatus comprising a first treatment station adapted for performing a physical vapor deposition process without application of an electrical bias potential to the workpieces; and at least one additional treatment station adapted for performing a physical vapor deposition process with application of an electrical bias to the workpieces or a plasma treatment with application of an electrical bias to said workpieces.

In accordance with certain embodiments of the present invention, step (a) comprises providing an in-line apparatus wherein at least one of the first deposition station and the at least one additional treatment station is a sputter deposition station; and step (a) further comprises providing a pallet adapted for mounting a plurality of disk-shaped workpieces, such that the pairs of opposing major surfaces thereof are exposed for treatment in the apparatus, each of the plurality of serially arranged treatment stations being adapted for treating both major surfaces of each of the plurality of disk-shaped workpieces.

According to particular embodiments of the present invention, step (b) comprises mounting a plurality of disk-shaped workpieces on the pallet, each of said workpieces comprising an electrically insulative substrate for a multi-layer, thin-film magnetic or magneto-optical recording medium; and steps (d) and (e) each comprise sputter depositing respective thin-film layers of the recording medium on both major surfaces of each of the plurality of disk-shaped workpieces.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon recognition by the inventor that the above-described limitations/drawbacks imposed by the use of conventional pallets for mounting and transporting a plurality of workpieces/substrates through an apparatus comprising a plurality of serially arranged treatment stations for performing a plurality of treatments of at least one surface thereof, wherein at least one of the treatments requires application of an electrical bias potential to the workpieces/substrates, can be overcome by utilizing pallets including electrical contact means adapted for selectively and controllably applying the electrical bias potential to each of the workpieces/substrates carried by the pallet past each of the treatment stations.

According to the invention, each of the plurality of electrical contact means comprises an electrically conductive member adapted for movement of a contact element thereof from a first, out-of-contact position spaced from a respective workpiece/substrate mounting region to a second, in-contact position adjacent the workpiece/substrate mounting region, and vice versa, and the treatment apparatus is provided with a means for selectively and controllably moving the plurality of electrical contact means from the first position to the second position, and vice versa, for selectively and controllably electrically contacting each of the plurality of workpieces/substrates during transport of the pallet past the plurality of treatment stations.

Figure 1:
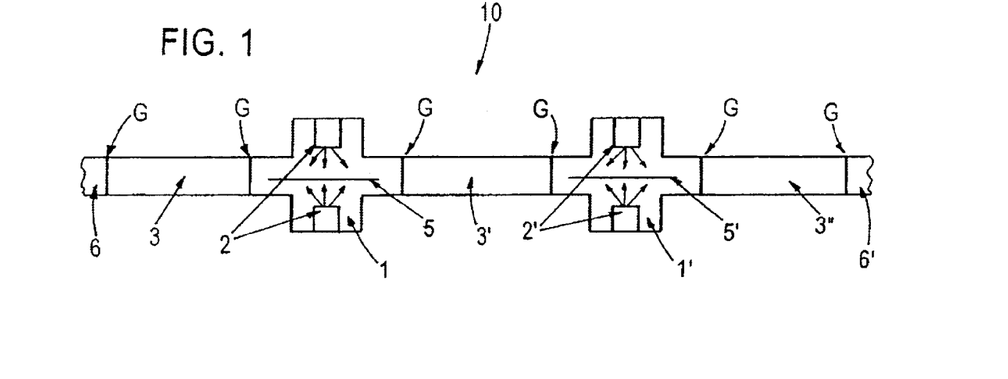
FIG. 1 is a simplified, schematic cross-sectional top view of an illustrative, but not limitative, embodiment of an in-line, pass-by apparatus for treating opposing surfaces of a plurality of vertically mounted workpieces/substrates according to the present invention.
Figure 2:
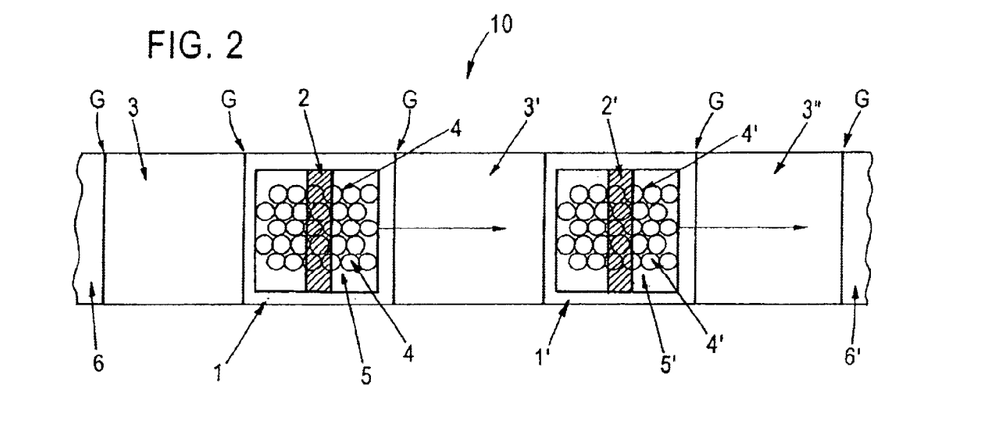
FIG. 2 is a simplified, schematic cross-sectional side view of the in-line apparatus shown in FIG. 1.

Referring now to FIGS. 1–2, shown therein, in simplified, schematic cross-sectional top and side views, respectively, is an illustrative, but not limitative, embodiment of an in-line, pass-by apparatus for treating opposing surfaces of a plurality of vertically mounted workpieces/substrates according to the present invention, which apparatus can, if desired, form part of a larger, in-line apparatus for continuous, automated manufacture of, e.g., magnetic and/or magneto-optical (MO) recording media such as hard disks, and wherein a plurality of workpieces/substrates (e.g. disks) are transported in a linear path transversely past at least one treatment station for treatment of at least one surface of each of the plurality of substrates.

More specifically, apparatus 10, as illustrated, comprises a series of linearly elongated, vacuum chambers interconnected by a plurality of gate means G of conventional design, including a plurality of treatment chambers or stations, illustratively a pair of treatment chambers or stations 1 and 1', each including at least one, preferably a pair of spaced-apart, oppositely facing, linearly elongated treatment sources 2, 2' (e.g., selected from among a variety of physical vapor deposition (PVD) sources, such as vacuum evaporation, sputtering, ion plating, etc. sources, and/or from among a variety of plasma treatment sources, such as sputter/ion etching, hydrogen, nitrogen, oxygen, argon, etc. plasma sources) for performing simultaneous treatment of both sides of dual-sided workpieces, and a pair of buffer/isolation chambers such as 3, 3' and 3', 3" at opposite lateral ends of respective treatment chambers or stations 1 and 1' for insertion and withdrawal, respectively, of a plurality of vertically oriented workpieces/substrates, illustratively a plurality disk-shaped substrates 4 carried by a plurality of workpiece/substrate mounting/transport means, illustratively means 5, 5', which, according to the present invention, may, e.g., be in the form of a perforated, flat planar pallet including conventional means (not shown in the drawing for illustrative simplicity) for releasably mounting/supporting the plurality of disk-shaped substrates 4 such that each of the opposing surfaces thereof face a respective linearly elongated treatment source 2, 2' during "pass-by" transport through apparatus 10. Chambers 6, 6' respectively connected to the distal ends of inlet and outlet buffer/isolation chambers 3, 3" are provided for use of apparatus 10 as part of a larger, continuously operating, in-line apparatus wherein workpieces/substrates 4 receive processing/treatment antecedent and/or subsequent to processing in apparatus 10.

Apparatus 10 is, if required by the nature/mode of operation of treatment sources 2, 2', provided with conventional vacuum means (not shown in the drawing for illustrative simplicity) for maintaining the interior spaces of each of the constituent chambers 1, 1', 3, 3', 3", etc. at a reduced pressure below atmospheric pressure, e.g., from about $10^{-5}$ to about $10^{-9}$ Torr, and is further provided with a workpiece/substrate conveyor/transporter means of conventional design (not shown in the drawings for illustrative simplicity) for linearly transporting the workpiece/substrate mounting means 5, 5' through the respective gate means G from chamber-to-chamber in its travel through apparatus 10.

As indicated above, according to a preferred embodiment of the present invention of particular utility in the manufacture of disk-shaped magnetic and/or MO recording media, the workpieces/substrates 4, 4' carried by mounting means 5, 5' are in the form of annular discs, with inner and outer diameters corresponding to those of conventional hard disc-type magnetic and/or MO media, and each of the illustrated treatment chambers 1, 1' of apparatus 10 is provided with a pair of opposingly facing, linearly extending physical vapor deposition sources 2, typically elongated magnetron sputtering sources, for deposition of respective constituent thin films of the multi-layer magnetic or MO media on each surface of each of the plurality of disks 4, 4' carried by the perforated pallet-type mounting means 5, 5'.

According to an illustrative, but not limitative, embodiment of the invention, each of the pallet-type mounting means 5, 5' for mounting/transporting a plurality of disk-shaped workpieces/substrates 4, 4', respectively, is generally similar to that shown and disclosed in U.S. Pat. No. 5,814,196 to Hollars, et al., the entire disclosure of which is incorporated herein for all purposes, but modified to include a plurality of electrical contact means comprised of an electrically conductive member adapted for movement of a contact element thereof from a first, out-of-contact position spaced from a respective workpiece/substrate to a second position in contact with the workpiece/substrate, and vice versa, and treatment apparatus 10 includes (see FIG. 6) a means for selectively and controllably moving the plurality of electrical contact means from the first position to the second position, and vice versa, for selectively and controllably electrically contacting each of the plurality of workpieces/substrates 4, 4' during transport of the respective pallets 5, 5' through each of the treatment chambers/stations 1, 1' and past the respective treatment sources 2, 2'.

Figure 3:
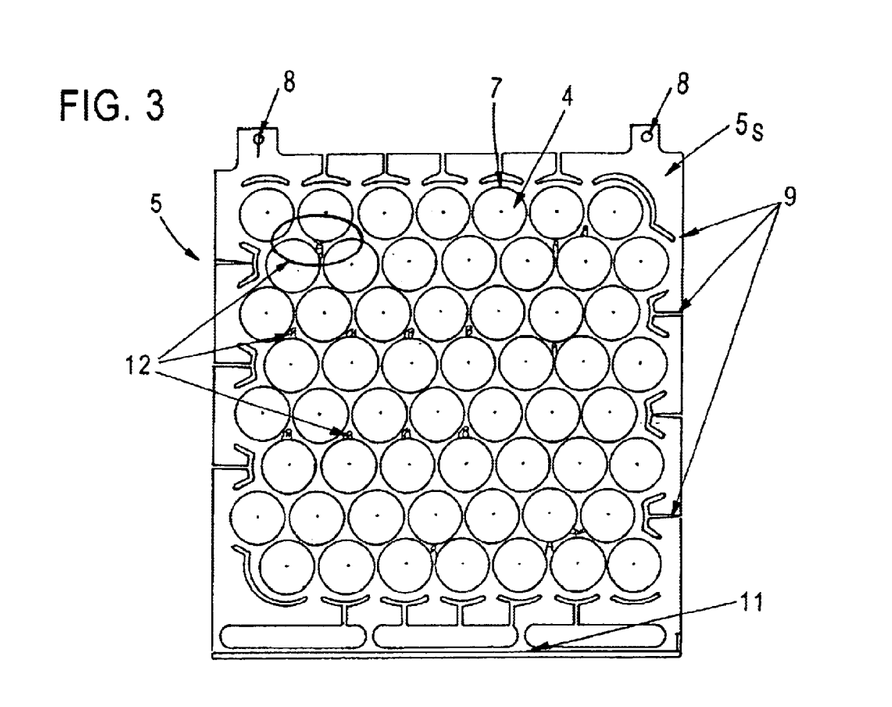
FIG. 3 is a simplified, schematic side view of a pallet according to the invention, adapted for mounting and transporting a plurality of vertically oriented, disk-shaped workpieces/substrates, for use in the in-line apparatus of FIGS. 1–2.

Adverting to FIG. 3, shown therein is a simplified, schematic side view of a pallet 5 according to the invention, illustratively, but not limitatively, adapted for mounting and transporting a plurality of vertically oriented, disk-shaped workpieces/substrates 4, e.g., for use in an in-line apparatus 19 of FIGS. 1–2 adapted for depositing a plurality of thin film layers constituting a multi-layer thin film stack or laminate of a magnetic or MO recording medium. Pallet 5 typically comprises an about 0.25" thick sheet $5_S$ of an electrically conductive material, e.g., Al or an Al-alloy, machined to include a plurality of generally circularly-shaped apertures 7 extending therethrough, each aperture 7 including a semicircularly extending groove formed in the lower half of the interior wall thereof for insertion and secure mounting of respective disk-shaped workpieces/substrates 4 therein, as is more fully described in the above-mentioned Hollars et al. U.S. Pat. No. 5,814,196. Pallet 5 further includes a pair of holes 8 extending through sheet $5_S$ at the top edge thereof for attachment to a linear transport mechanism (of conventional design not described herein for brevity) of apparatus 10 for moving pallet 5 through each of the serially arranged isolation and treatment (e.g., deposition) chambers, gates, air locks, etc., and a plurality of slots 9 extending through sheet $5_S$ at various locations about the periphery thereof for providing stress relief and thermal isolation during passage through apparatus 10, also as described more fully in U.S. Pat. No. 5,814,196. Contact bar 11 is provided at the lower edge of sheet $5_S$ for making sliding electrical contact with a conductive rail at the bottom of one or more of the treatment chambers/stations 1, 1', etc. for application of a suitable DC, AC, or RF combined bias potential (or a combination thereof) to sheet $5_S$.

A key feature of the present invention is provision of pallets 5,5' with a plurality of electrical contact means 12 for selectively and controllably electrically contacting respective workpieces/substrates 4 for selectively and controllably applying an electrical bias potential thereto during passage of pallets 5, 5' through treatment chambers/stations 1, 1'. As illustrated in FIG. 3, an electrical contact means 12 is provided in some or all (preferably all) of the inter-aperture regions of sheet $5_S$ (i.e., between adjacent apertures 7), each contact means 12 comprising an electrically conductive member adapted for movement of a contact element thereof from a first, out-of-contact position spaced from a respective region to a second, in-contact position adjacent said region, and vice versa.

Figure 4:
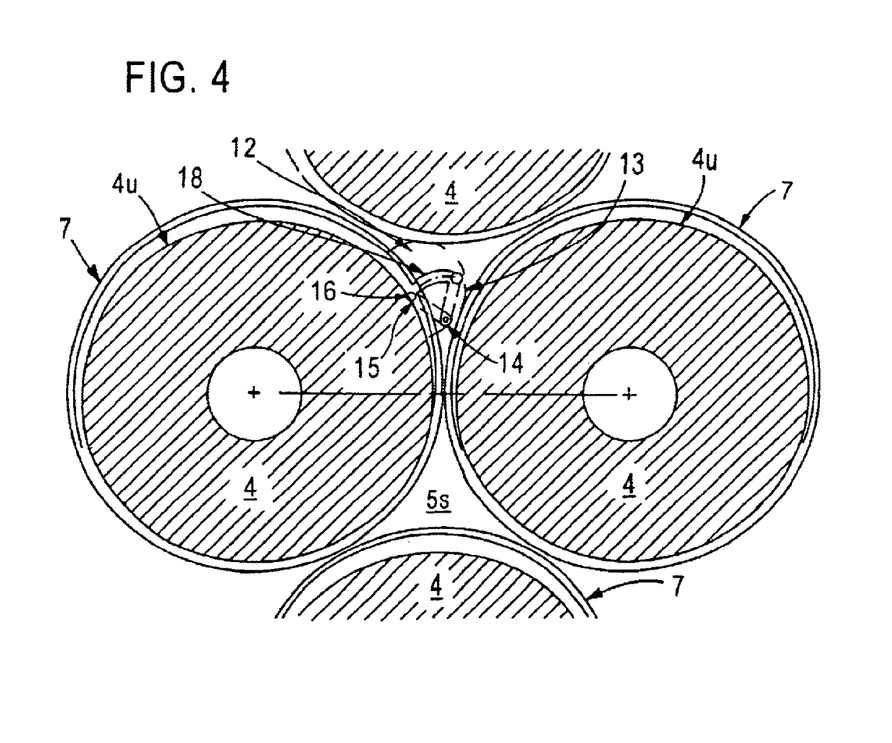
FIG. 4 is a simplified, schematic, enlarged view of a portion of the pallet of FIG. 3 illustrating details of an illustrative, but not limitative, embodiment of a selectively and controllably movable electrical contact arrangement according to the present invention.

Referring to FIG. 4, shown therein is a simplified, schematic, enlarged view of a portion of the pallet of FIG. 3 illustrating details of an illustrative, but not limitative, embodiment of a selectively and controllably movable electrical contact means 12 according to the present invention, comprising an elongated electrically conductive member 13 pivotably mounted at a first end 14 thereof to electrically conductive sheet $5_S$ for moving a second end 15 thereof comprising the contact element 16 from first, out-of-contact position to the second, in-contact position, and vice versa, with movement of contact means 12 between the first and second positions guided along a fixed path by an integrally formed tab 17 (see FIG. 5) extending through arcuate groove 18 formed in sheet $5_S$.

Figure 5:
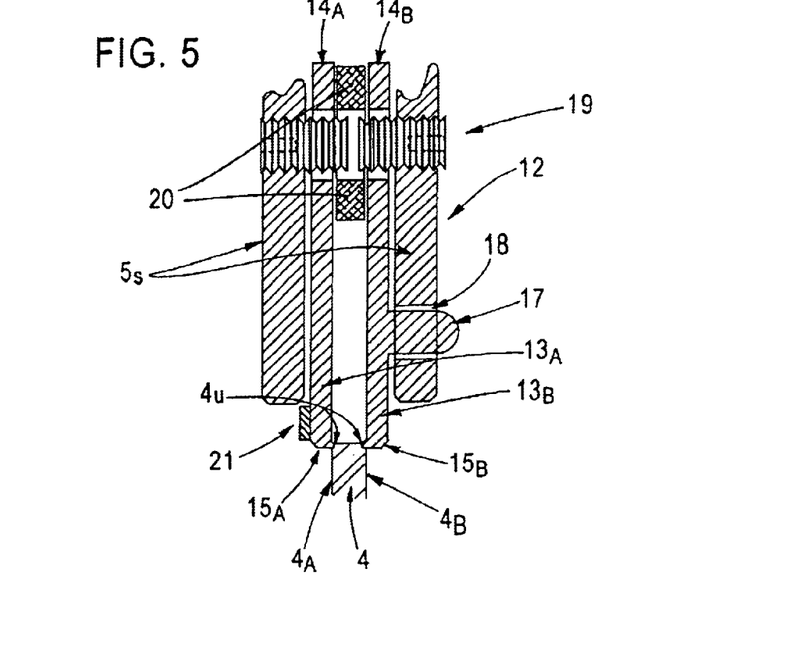
FIG. 5 is a simplified, schematic, partial vertical cross-sectional view of an illustrative, but not limitative, embodiment of a movable electrical contact arrangement according to FIG. 4 adapted for independently providing selectable and controllable contact to an oppositely facing pair of workpiece/substrate surfaces.

FIG. 5 shows a simplified, schematic, partial vertical cross-sectional view of an illustrative, but not limitative, embodiment of a movable electrical contact means 12 according to FIG. 4, adapted for independently providing selectable and controllable contact to each of an oppositely facing pair of workpiece/substrate surfaces. According to this embodiment, contact means 12 comprises a pair of electrically conductive contact members $13_A$ and $13_B$ independently pivotably mounted at respective first ends $14_A$ and $14_B$ to electrically conductive pallet sheet $5_S$ via pivot 19 and spaced apart by electrically conductive washer 20, with their respective second ends $15_A$ and $15_B$ comprising respective contact elements $16_A$ and $16_B$ adapted to contact bevelled edges of respective surfaces $4_A$ and $4_B$ of workpiece/substrate 4 for making electrical contact therewith. According to the invention, electrical contact to a conductive layer (or layers) previously formed on a least one of surface of surfaces $4_A$ and $4_B$ of workpiece/substrate 4 utilizing pallet 5 in the illustrated fashion is facilitated by the full exposure of the upper portion $4_U$ of each workpiece/substrate 4 afforded by pallet 5, including the respective bevelled edges thereof, to treatment provided by treatment source(s) 2, e.g., a coating material flux (see FIG. 4). An advantage provided by the recessed shaft of pivot 19, about which contact members $13_A$ and $13_B$ rotate, is prevention of deposit build-up thereon which may ultimately interfere with rotation thereof.

Selective and controllable actuation of each of the independently pivotable contact members $13_A$ and $13_B$ may be accomplished in different ways. For example, as illustrated in FIG. 5, contact member $13_A$ comprises a magnetic element 21 on a portion thereof, or may be entirely fabricated of an electrically conductive, magnetic material for interacting with an elongated magnet means 22 forming part of apparatus 10 (see FIG. 6); whereas contact member $13_B$ may utilize tab 17 extending through guide groove for mechanically activated movement via interaction with a means provided within apparatus 10 (see FIG. 6), or tab 17 may comprise a magnetic material for interaction with magnet means 22. Alternatively, both contact members $13_A$ and $13_B$ may be pivotally actuated in similar fashion utilizing a single one of the above-described means.

Figure 6:
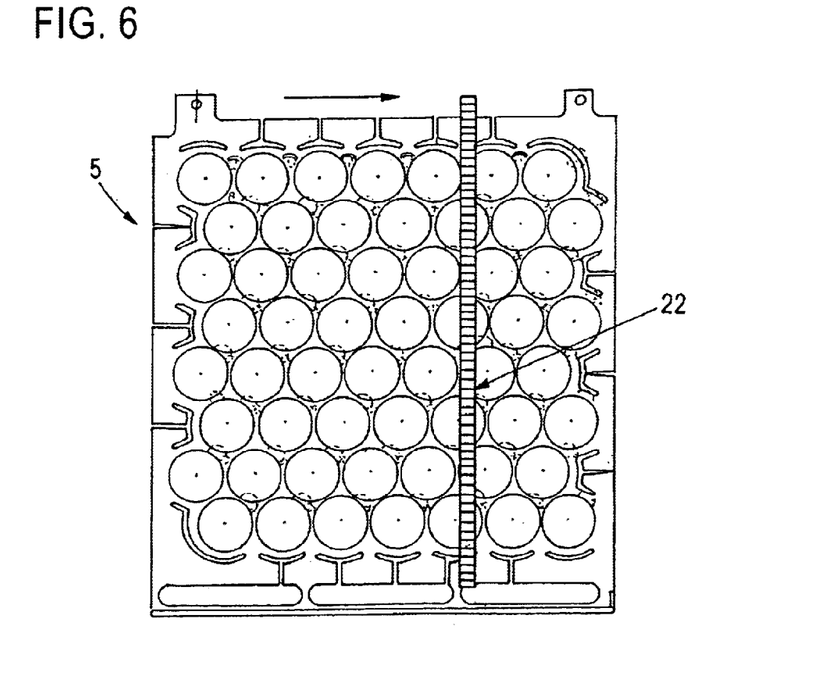
FIG. 6 is a simplified, schematic side view of a pallet according to the invention, together with an illustrative, but not limitative, embodiment of a means provided within the apparatus for operating the selectively and controllably movable contact arrangements according to the present invention.

Referring now to FIG. 6, shown therein is a simplified, schematic side view of a pallet 5 according to the invention, together with a means 22 provided within apparatus 5 for operating the selectively and controllably movable contact means 12 according to the present invention. According to one embodiment useful with contact means 12 wherein the contact members 13 are formed of a magnetic material or comprise a magnetic tab 17 or element 21, apparatus 10 is provided with a stationary array 22 of bar magnets (of permanent or electromagnetic type) for pivoting the contact arms from the first, out-of-contact position to the second position in contact with the edges of the disk-shaped workpieces/substrates 4 mounted in apertures 7 of pallet 5. According to another embodiment useful with contact members 13 having outwardly extending tabs 17, apparatus 10 includes an elongated bar means 22 movable in two dimensions, i.e., leftward/rightward and towards/away from tabs 17, with motion of means 22 controllably supplied via mechanical means, e.g., solenoid or pneumatic means. Movement of contact members 13 from the first, out-of-contact position to the second, in-contact position is effected just prior to the point in the pallet motion when substrate bias is to be applied, as in treatment involving film deposition by bias sputtering. Contacts 13 may be returned to their first, out-of-contact position at any time either mechanically or magnetically when pallet 5 passes a contact reset station. Magnetic actuation of contact members 13 is considered preferable to mechanical actuation in that metal-to-metal contact does not occur; hence there is no possibility of disadvantageous particle generation via abrasive interaction.

In a typical operating sequence of apparatus 10, a plurality of workpieces of any desired shape are mounted on appropriately configured pallets 5, 5', etc., each of the workpieces comprising an electrically insulative substrate 4; the pallets with the plurality of substrates mounted thereon are transported past the plurality of treatment stations; each of the plurality of electrical contacts are maintained in the first, out-of-contact position when the pallets pass through the first treatment (i.e., sputter deposition) chamber/station 1 wherein a first, electrically conductive layer is sputter deposited on the exposed surfaces of each of the plurality of substrates 4 (including the bevelled edges at the upper portion $4_U$) without application of an electrical bias potential to substrates 4; the pallets 5, 5' with the substrates with the electrically conductive layer thereon are then serially transported through intervening buffer/isolation chambers 3', etc., to and through at least one, typically several, additional treatment chambers/stations, illustratively second treatment chamber/station 1', wherein each of the plurality of electrical contacts 12 is moved from the first, out-of-contact position to the second position in contact with the previously deposited electrically conductive layers formed on each of the substrate surfaces, and at least one treatment (typically several treatments, e.g., selected from physical vapor deposition such as sputtering and plasma treatment) performed on the surfaces of each of the plurality of substrates, while applying a selected electrical bias potential to each of the workpieces.

The inventive apparatus and method enjoys particular utility in the manufacture of multi-layer, thin-film magnetic and/or MO recording media utilizing non-conductive substrates such as of glass, ceramic, glass-ceramics, polymers, and composites and laminates thereof, wherein the manufacturing process involves deposition and/or treatment steps requiring application of an electrical bias to the workpiece/substrate for obtaining desired film properties. The inventive apparatus advantageously eliminates the requirement for deposition of an electrically conductive layer in a separate vacuum system. In addition, the inventive methodology enjoys full compatibility with all other aspects of automated magnetic and MO media manufacture and the inventive concept is broadly applicable to the manufacture of a variety of different products, e.g., coated architectural glass and optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A pallet for transporting a plurality of workpieces/substrates through an apparatus adapted for performing at least one treatment of at least one surface of each of said workpieces/substrates, comprising:

(a) a sheet of electrically conductive material provided with a plurality of spaced-apart regions extending at least partway therethrough, each of said regions adapted to mount therein and expose at least one major surface of respective workpieces/substrates for receipt of said treatment; and (b) a plurality of electrical contact means for selectively and controllably electrically contacting respective ones of said plurality of workpieces/substrates for applying an electrical bias potential thereto during said treatment.

2. The pallet as in claim 1, wherein:

each of said plurality of electrical contact means (b) comprises an electrically conductive member adapted for movement of a contact element thereof from a first, out-of-contact position spaced from a respective region to a second, in-contact position adjacent said region, and vice versa.

3. The pallet as in claim 2, wherein:

each of said plurality of electrical contact means (b) comprises an elongated electrically conductive member pivotably mounted to said sheet of electrically conductive material (a) at a first end thereof for moving a second end thereof comprising said contact element from said first position to said second position, and vice versa.

4. The pallet as in claim 2, wherein:

each of said plurality of said regions of said sheet of electrically conductive material (a) comprises an aperture extending through said sheet for exposing a pair of opposed major surfaces of respective workpieces/substrates for receipt of said treatment; and each of said contact elements of said plurality of electrical contact means (b) is adapted to provide electrical contact to respective pairs of opposed major surfaces of said workpieces/substrates.

5. The pallet as in claim 4, wherein:

each of said plurality of apertures in said sheet of electrically conductive material (a) is substantially circularly-shaped and adapted for mounting a disk-shaped workpiece/substrate therein.

6. The pallet as in claim 4, wherein:

each of said plurality of electrical contact means (b) is provided in areas of said sheet of electrically conductive material (a) between adjacent apertures.

7. The pallet as in claim 2, wherein:

each of said plurality of electrical contact means (b) is electrically connected to said sheet of electrically conductive material (a).

8. The pallet as in claim 2, wherein:

said sheet of electrically conductive material (a) is comprised of a non-magnetic material; and at least a portion of each of said plurality of electrical contact means (b) comprises a magnetic material for cooperating with a magnet means of said apparatus for moving said electrical contact means (b) from said first position to said second position, and vice versa.

9. The pallet as in claim 2, wherein:

each of said plurality of electrical contact means (b) comprises a tab means for providing at least one of: (1) guiding movement of said electrical contact means (b) from said first position to said second position, and vice versa; and (2) cooperating with a mechanical means of said apparatus for moving said electrical contact means (b) from said first position to said second position, and vice versa.

10. An apparatus for performing a plurality of treatments of at least one surface of each of a plurality of workpieces/substrates, comprising:

(a) a plurality of treatment stations for performing a corresponding plurality of treatments of said at least one surface of each of said plurality of workpieces/substrates;

(b) a pallet adapted for mounting said plurality of workpieces/substrates, said pallet comprising:

($b_1$) a sheet of electrically conductive material provided with a plurality of spaced-apart regions extending at least partway therethrough, each of said regions adapted to mount therein and expose at least one major surface of respective workpieces/substrates for receipt of said treatment provided by said at least one treatment station; and ($b_2$) a plurality of electrical contact means for selectively and controllably electrically contacting respective ones of said plurality of workpieces/substrates for applying an electrical bias potential thereto during said treatment;

(c) means for transporting said pallet past said plurality of treatment stations; and (d) means for moving said plurality of electrical contact means ($b_2$) from a first position to a second position, and vice versa, for selectively and controllably electrically contacting each of said plurality of workpieces/substrates during transport of said pallet past said plurality of treatment stations.

11. The apparatus as in claim 10, wherein:

each of said plurality of electrical contact means ($b_2$) comprises an electrically conductive member adapted for movement of a contact element thereof from a first, out-of-contact position spaced from a respective region to a second, in-contact position adjacent said region, and vice versa.

12. The apparatus as in claim 11, wherein:

each of said plurality of electrical contact means ($b_2$) comprises an elongated electrically conductive member pivotably mounted to said sheet of electrically conductive material (a) at a first end thereof for moving a second end thereof comprising said contact element from said first position to said second position, and vice versa.

13. The apparatus as in claim 11, wherein:

each of said regions of said sheet of electrically conductive material ($b_1$) comprises an aperture extending through said sheet for exposing a pair of opposed major surfaces of respective workpieces/substrates for receipt of said treatment; and each of said contact elements of said plurality of electrical contact means ($b_2$) is adapted to provide electrical contact to each of said pairs of opposed major surfaces of said workpieces/substrates.

14. The apparatus as in claim 13, wherein:

each of said plurality of apertures in said sheet of electrically conductive material ($b_1$) is substantially circularly-shaped and adapted for mounting a disk-shaped workpiece/substrate therein.

15. The apparatus as in claim 13, wherein:

each of said plurality of electrical contact means ($b_2$) is provided in areas of said sheet of electrically conductive material ($b_1$) between adjacent apertures.

16. The apparatus as in claim 11, wherein:

each of said plurality of electrical contact means ($b_2$) is electrically connected to said sheet of electrically conductive material ($b_l$).

17. The apparatus as in claim 11, wherein:

said sheet of electrically conductive material ($b_1$) is comprised of a non-magnetic material;

at least a portion of each of said plurality of electrical contact means ($b_2$) comprises a magnetic material; and said contact moving means (d) comprises magnet means for cooperating with said portion of magnetic material for moving said electrical contact means ($b_2$) from said first position to said second position, and vice versa.

18. The apparatus as in claim 11, wherein:

each of said plurality of electrical contact means ($b_2$) comprises a tab means for providing at least one of: (1) guiding movement of said electrical contact means ($b_2$) from said first position to said second position, and vice versa; and (2) cooperating with said contact moving means (d) for moving said electrical contact means ($b_2$) from said first position to said second position, and vice versa.

19. The apparatus as in claim 18, wherein:

said contact moving means (d) comprises mechanical means for moving said electrical contact means ($b_2$) from said first position to said second position, and vice versa.

20. The apparatus as in claim 10, wherein:

said pallet (b) is adapted for mounting a plurality of vertically oriented workpieces/substrates.

21. The apparatus as in claim 10, wherein:

said plurality of treatment stations (a) are physical vapor deposition (PVD) stations.

22. The apparatus as in claim 21, wherein:

said physical vapor deposition (PVD) stations are sputter deposition stations.

23. The apparatus as in claim 10, wherein:

said plurality of treatment stations (a) include at least one plasma treatment station.

24. The apparatus as in claim 10, wherein:

said apparatus is an in-line apparatus comprising a linearly arranged plurality of treatment stations (a) selected from among physical vapor deposition stations and plasma treatment stations.

25. The apparatus as in claim 24, wherein:

each of said plurality of treatment stations (a) is adapted for treating opposing surfaces of each of said plurality of workpieces/substrates.

26. A method of treating a plurality of workpieces, comprising steps of:

(a) providing an apparatus comprising:
(i) a plurality of serially arranged treatment stations for performing respective treatments of at least one surface of each of said plurality of workpieces;
(ii) a pallet adapted for mounting said plurality of workpieces, said pallet comprising:
a sheet of electrically conductive material provided with a plurality of spaced-apart regions extending at least partway therethrough, each of said regions adapted to mount therein and expose at least one major surface of a respective workpiece for treatment by each said treatment station; and
a plurality of electrical contact means for selectively and controllably electrically contacting respective ones of said plurality of workpieces for applying an electrical bias potential thereto during said treatment;
(iii) means for transporting said pallet past said plurality of serially arranged treatment stations; and
(iv) means for moving said plurality of electrical contact means from a first position out-of contact with respective ones of said workpieces to a second position in contact with respective ones of said workpieces, and vice versa, for selectively and controllably electrically contacting each of said plurality of workpieces during transport of said pallet past said plurality of treatment stations for selectively and controllably applying an electrical bias potential to each of said plurality of workpieces;

(b) mounting a plurality of workpieces on said pallet, each of said workpieces comprising an electrically insulative substrate;

(c) transporting said pallet with said plurality of workpieces mounted thereon past said plurality of treatment stations;

(d) maintaining each of said plurality of electrical contacts in said first position out-of-contact with a respective workpiece and depositing a first, electrically conductive layer on said at least one exposed surface of each of said plurality of workpieces at a first treatment station of said apparatus, whereby electrical bias potential is not applied to each of said plurality of workpieces during deposition of said first, electrically conductive layer; and (e) moving each of said plurality of electrical contacts to said second position in contact with a respective electrically conductive layer and performing at least one treatment of said at least one exposed surface of each of said plurality of workpieces at at least one serially positioned additional treatment station of said apparatus downstream of said first treatment station, while applying a selected electrical bias potential to each of said workpieces.

27. The method according to claim 26, wherein:

step (a) comprises providing an in-line apparatus comprising:
a first treatment station adapted for performing a physical vapor deposition process without application of an electrical bias potential to said workpieces; and
at least one additional treatment station adapted for performing a physical vapor deposition process with application of an electrical bias to said workpieces or a plasma treatment with application of an electrical bias to said workpieces.

28. The method according to claim 27, wherein:

step (a) comprises providing an in-line apparatus wherein at least one of said first deposition station and said at least one additional treatment station is a sputter deposition station.

29. The method according to claim 28, wherein:

step (a) comprises providing a pallet adapted for mounting a plurality of disk-shaped workpieces, such that the pairs of opposing major surfaces thereof are exposed for treatment in said apparatus, each of said plurality of serially arranged treatment stations being adapted for treating both said major surfaces of each of said plurality of disk-shaped workpieces.

30. The method according to claim 29, wherein:

step (b) comprises mounting a plurality of disk-shaped workpieces on said pallet, each of said workpieces comprising an electrically insulative substrate for a multi-layer, thin-film magnetic or magneto-optical recording medium; and steps (d) and (e) each comprise sputter depositing respective thin-film layers of said recording medium on both said major surfaces of each of said plurality of disk-shaped workpieces.

* * * * *